United States Patent [19]

Hashimoto

[11] Patent Number: 4,956,820

[45] Date of Patent: Sep. 11, 1990

[54] ARBITER CIRCUIT FOR ESTABLISHING PRIORITY CONTROL OF READ, WRITE AND REFRESH OPERATIONS WITH RESPECT TO MEMORY ARRAY

[75] Inventor: Masashi Hashimoto, Garland, Tex.

[73] Assignee: Texas Instruments Incorporated, Dallas, Tex.

[21] Appl. No.: 161,059

[22] Filed: Feb. 26, 1988

[30] Foreign Application Priority Data

Mar. 11, 1987 [JP] Japan .................................. 62-56117

[51] Int. Cl.$^5$ .............................................. G11C 7/00
[52] U.S. Cl. .................................... 365/222; 365/233; 365/195; 365/189.07; 365/189.08; 365/230.03
[58] Field of Search ............... 365/233, 222, 221, 236, 365/240, 239, 78, 195, 189.07, 189.08, 230.03

[56] References Cited

U.S. PATENT DOCUMENTS

| | | | |
|---|---|---|---|
| 4,635,224 | 1/1987 | Müller | 365/222 |
| 4,757,217 | 7/1988 | Sawada et al. | 365/222 |
| 4,758,991 | 7/1988 | Ichida | 365/233 |
| 4,780,849 | 10/1988 | Nakagawa | 365/233 |

OTHER PUBLICATIONS

Computer Design, vol. 22, Mar. 83, No. 3/Integrated CRTs, "The Chip That Refreshes Itself" by Fallin et al., pp. 111-118.

Primary Examiner—Stuart N. Hecker
Assistant Examiner—Alfonso Garcia
Attorney, Agent, or Firm—William E. Hiller; N. Rhys Merrett; Melvin Sharp

[57] ABSTRACT

An arbiter circuit providing priority control of dynamic memory operations as a memory access signal control circuit which regulates the order in which dynamic memory access signals, such as read, write and refresh signals, are executed in effecting particular operating functions of a dynamic memory. The arbiter circuit has a first circuit element to temporarily hold a given access signal or signals, a second circuit element to inhibit transfer of any access signal when another access signal is already being executed, a third circuit element to synchronize individual access signals that are generated asynchronously, and a fourth circuit element to reset arbiter circuit upon the end of each access signal. The memory access signals or request signals are queued as necessary according to a priority allocation such that a write request signal heads the priority list, followed by a refresh request signal and a read request signal in order.

7 Claims, 14 Drawing Sheets

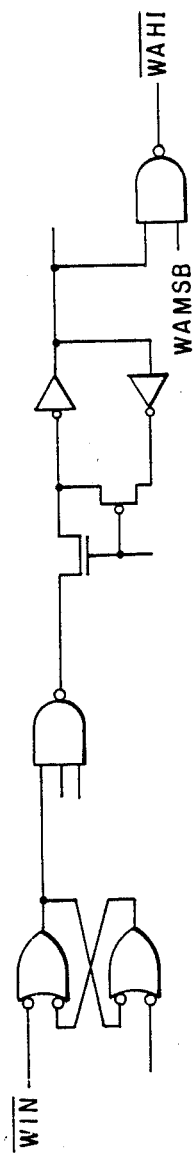
Fig.7
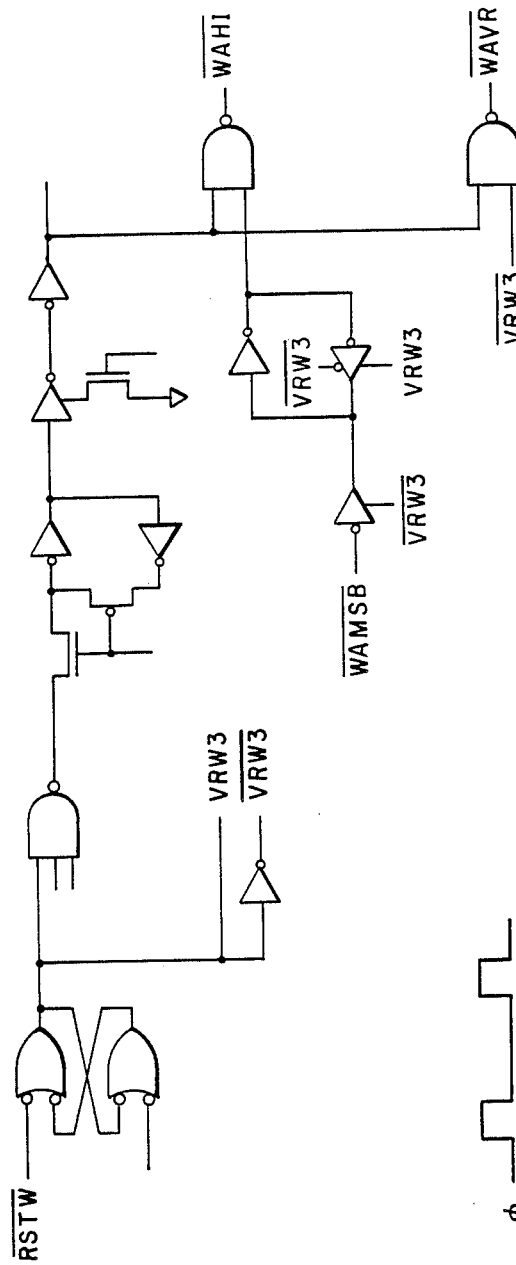
Fig.8
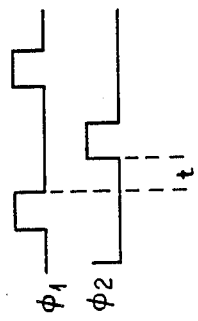

ARBITER CIRCUIT FOR ESTABLISHING PRIORITY CONTROL OF READ, WRITE AND REFRESH OPERATIONS WITH RESPECT TO MEMORY ARRAY

BACKGROUND OF THE INVENTION

1. Field of the Invention

This invention relates to an arbiter circuit providing priority control of dynamic memory operations as a memory access signal control circuit.

2. Description of the Prior Art

As the FIFO (First In First Out) memory device, for example, two commercial products are known under names, µPD41101C and CXK1202S, respectively. Also some FIFO memory devices have been disclosed in the 1986 national conference of the Institute of Electronics and Communication Engineers of Japan. When disclosed, all these devices were designated as the line memory. Though characterized by fast read and write cycles, each as fast as around 30 nsec, these devices have modest storage capacities of about 2 kbits per port at most.

To increase the storage capacity, the memory configuration must be simplified as much as possible to allow for higher circuit integration. Being designed for a memory configuration similar to the static RAM (Random Access Memory), however, the above FIFO memory devices, though simple to control for read and write and capable of readily achieving highspeed operation, have a problem of insufficient circuit integration.

Meanwhile, a semiconductor memory device of the DRAM (Dynamic Random Access Memory) type provided with dynamic memory elements and having an additional internal circuit as a means to provide control for memory refreshing without recourse to any external control signal is described in application Ser. No. 083,555 filed Aug. 7, 1987. The basic design of this memory device includes line buffers for serial-parallel and parallel-serial conversion of data, further having an oscillator or oscillators, for example, of ring type, a counter or counters to count oscillation pulses from such oscillators, signal generators to generate the read and write request signals, another signal generator to generate the refresh request signal, and an arbiter circuit to determine priority depending on circumstances between read, write and refresh request signals as these signals are generated.

OBJECTS AND SUMMARY OF THE INVENTION

An object of the invention is to provide a memory access signal control circuit, or arbiter circuit, which is effectively designed so as to consistently process various memory access signals (read, write and refresh request signals) in a desired priority sequence.

Namely, the invention relates to a memory access signal control circuit, or arbiter circuit, that controls memory access priority as between write, read and refresh signals, wherein the arbiter circuit includes a first circuit element to temporarily hold access signals as they are given, a second circuit element to inhibit transfer of any access signal during execution of another access signal, a third circuit element to synchronize individual access signals that are generated asynchronously, and a fourth circuit element to reset the arbiter circuit upon switching off of the access signal under execution.

Other objects, features and advantages of the invention will appear more fully from the following detailed description thereof taken in connection with the accompanying drawings.

BRIEF DESCRIPTION OF THE DRAWINGS

FIGS. 7 and 8 respectively show logic circuit diagrams of circuits employed for row addressing.

DESCRIPTION OF THE PREFERRED EMBODIMENTS

Basic circuit configuration

Figure 1:
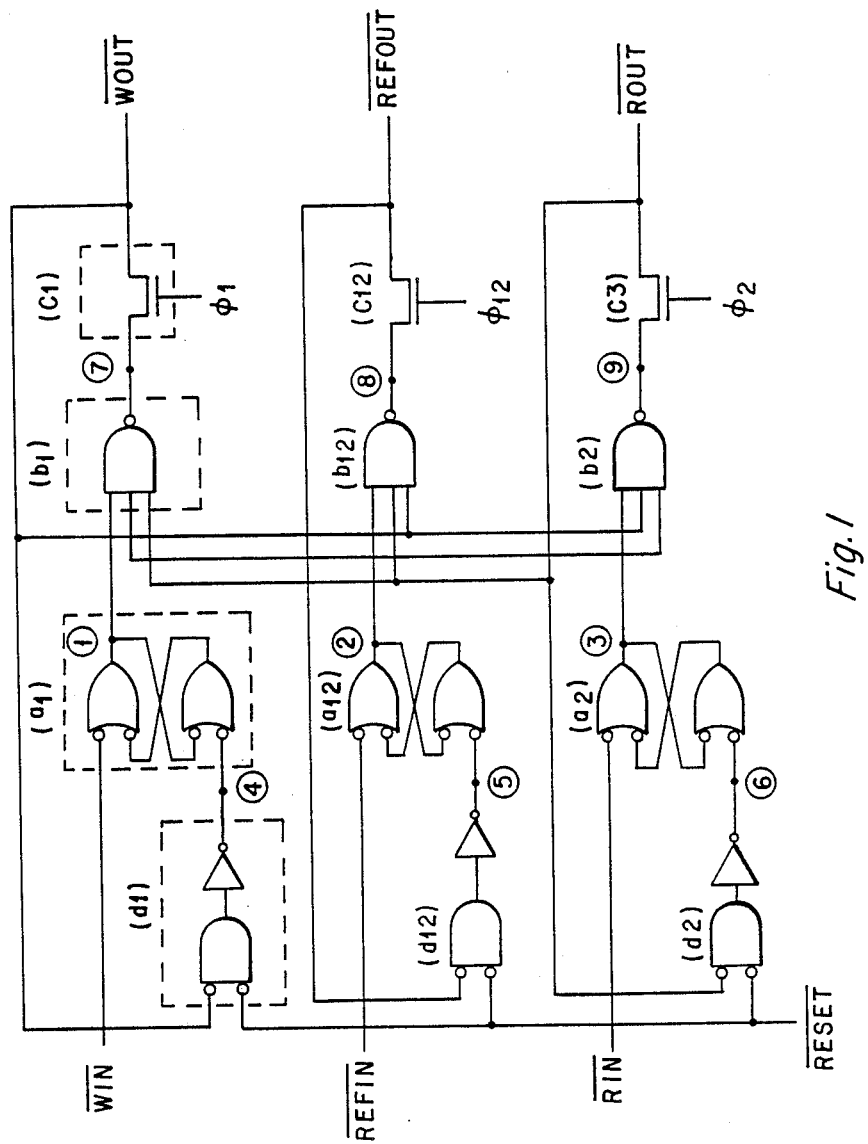
FIG. 1 is a logic circuit diagram of an arbiter circuit in accordance with the present invention.
Figure 14:
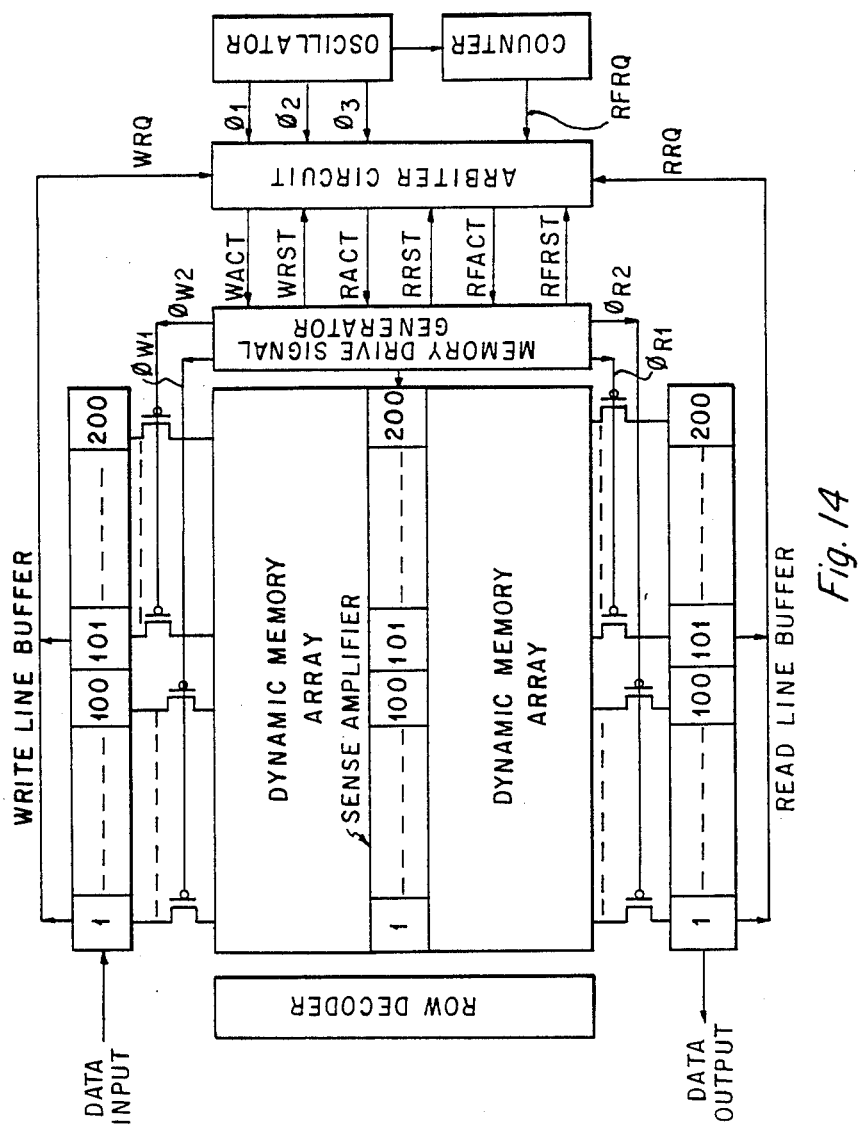
FIG. 14 is a schematic circuit configuration of a memory device as disclosed in copending U.S. application Ser. No. 083,555 filed Aug. 7, 1987 in which an arbiter circuit is incorporated.

FIG. 1 is an arbiter circuit to control read, write and refresh request signals (namely, dynamic memory access signals) for sequential execution depending on given situations as these signals are generated asynchronously. For example, referring to the memory device of FIG. 14, if a read request signal to read data from the dynamic memory array is generated while data is being transferred from the line buffer to the same memory array during execution of a write access signal, the arbiter circuit of FIG. 1 holds the read request signal temporarily until the on-going write cycle is completed so the read access signal may then be generated. For the above operation, the following four basic circuit elements are used:

(1) Circuit element to temporarily hold a given request signal - RS flip-flop ("a" in drawings);

(2) Circuit element to inhibit transfer of any access signal during execution of another access signal -NAND gate ("b" in drawings);

(3) Circuit element to synchronize access signals that are generated asynchronously - clocked gate ("c" in drawings); and (4) Circuit element to generate the reset signal - AND gate having both inputs inverted to provide an OR logic function ("d" in drawings).

Basic operation

The arbiter circuit controls request signals for sequential execution according to priority as mentioned below in detail.

First, in the standby mode in which no read, write, or refresh request signal is generated ($\overline{WIN}$, $\overline{REFIN}$ and $\overline{RIN}$ are all at the high level), of the outputs ①, ② and ③ of RS flip-flops a1, a12 and a2 are low.

The $\overline{RESET}$ signal, which is a signal that is temporarily set low upon completion of a sequence of operations for memory array access, is generated by an internal circuit. In the standby mode, also this signal is high. $\overline{WOUT}$, $\overline{REFOUT}$ and $\overline{ROUT}$, signals for memory array access, which are high in the standby mode, are set low as the $\overline{WIN}$, $\overline{REFIN}$ and $\overline{RIN}$, respectively, switch low.

To transfer data from the write line buffer to the memory array, the signal $\overline{WIN}$ dips temporarily (one-shot low signal) to indicate to the arbiter circuit a write request. The point ① then immediately switches high and the point ⑦ low, though $\overline{WOUT}$ stays high as long as the clock signal $\phi 1$ is low. $\overline{WOUT}$ then becomes low at the rising edge of clock $\phi 1$ to generate a memory access signal. This signal is also input to gates b12 and b2 to lock these gates so as to be insensitive to any changes in voltage output from gates A12 and A2. At this state, therefore, even if $\overline{REFIN}$ and $\overline{RIN}$ are set low, $\overline{REFOUT}$ and $\overline{ROUT}$ always remain high. In case the three request signals $\overline{WIN}$, $\overline{REFIN}$ and $\overline{RIN}$ switch low simultaneously, synchronizing gates "c" determine priority between these signals. Namely, if $\phi 2$ is already low but $\phi 1$ is still high at the timing when these three signals are switched low, $\overline{WIN}$ is given priority to turn $\overline{WOUT}$ low. At the same time, the outputs ⑧ and ⑨ from gates b12 and b2, respectively, reset high. The above switching condition continues until the memory access operation triggered by $\overline{WOUT}$ is completed to set $\overline{RESET}$ low.

As $\overline{RESET}$ becomes low, the output ① from flip-flop a1 immediately switches low while the output ⑦ from gate b1 is high. Further, at the timing when $\phi 1$ is set high, $\overline{WOUT}$ switches high to release the gates b12 and b2 from inhibition of effective signal input. Accordingly, both points ⑧ and ⑨ are set low. Subsequently, at the timing when $\phi 12$ switches high, $\overline{REFOUT}$ is set low, so signal input to gates b1 and b2 is then inhibited to reset the point ⑨ high while the memory access operation is triggered by the $\overline{REFOUT}$ signal.

It is thus obvious from the above explanation that request signals are queued according to priority as follows:

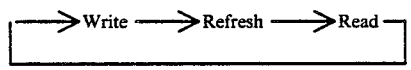

In case the Address Reset Signal is in case the address reset signal is added

To read from or write to the FIFO memory, it is necessary to assign a starting address for the read or write function. This assignment relies on the operator, who must input an external signal. The start address assignment is to reset the address. Thus, the above external signal is either the reset write signal $\overline{RSTW}$ or reset read signal $\overline{RSTR}$. The reset write and reset read operations are slightly different in control, so these operations are separately described below:

(1) Reset write operation

Data is written to the memory array through the write line buffer, which is functionally halved for divided use. for the sake of descriptional convenience, it may be assumed that a 200-bit write line buffer is halved into two 100-bit sections. Data is written sequentially from the top address of one section. As this section gets full with the 100th data bit, data write to the other section starts from the top address thereof and at the same time a write request signal $\overline{WIN}$ is generated to write 100 data bits from the first section to the memory array. If a reset write request signal is now generated, write data is naturally assigned to the memory array sequentially from the address zero thereof. The above $\overline{WIN}$ request signal just transfers 100 data bits. Accordingly, data that has been written to the other section since the last $\overline{WIN}$ request signal was generated remains there without being written to the memory array. Of course, this data must also be transferred to the memory array for storage. When $\overline{RSTW}$ is input, therefore, following the request signal $\overline{WIN}$, another request signal $\overline{WOUT}$ must be generated to order the line buffer to transfer data therefrom.

Figure 2:
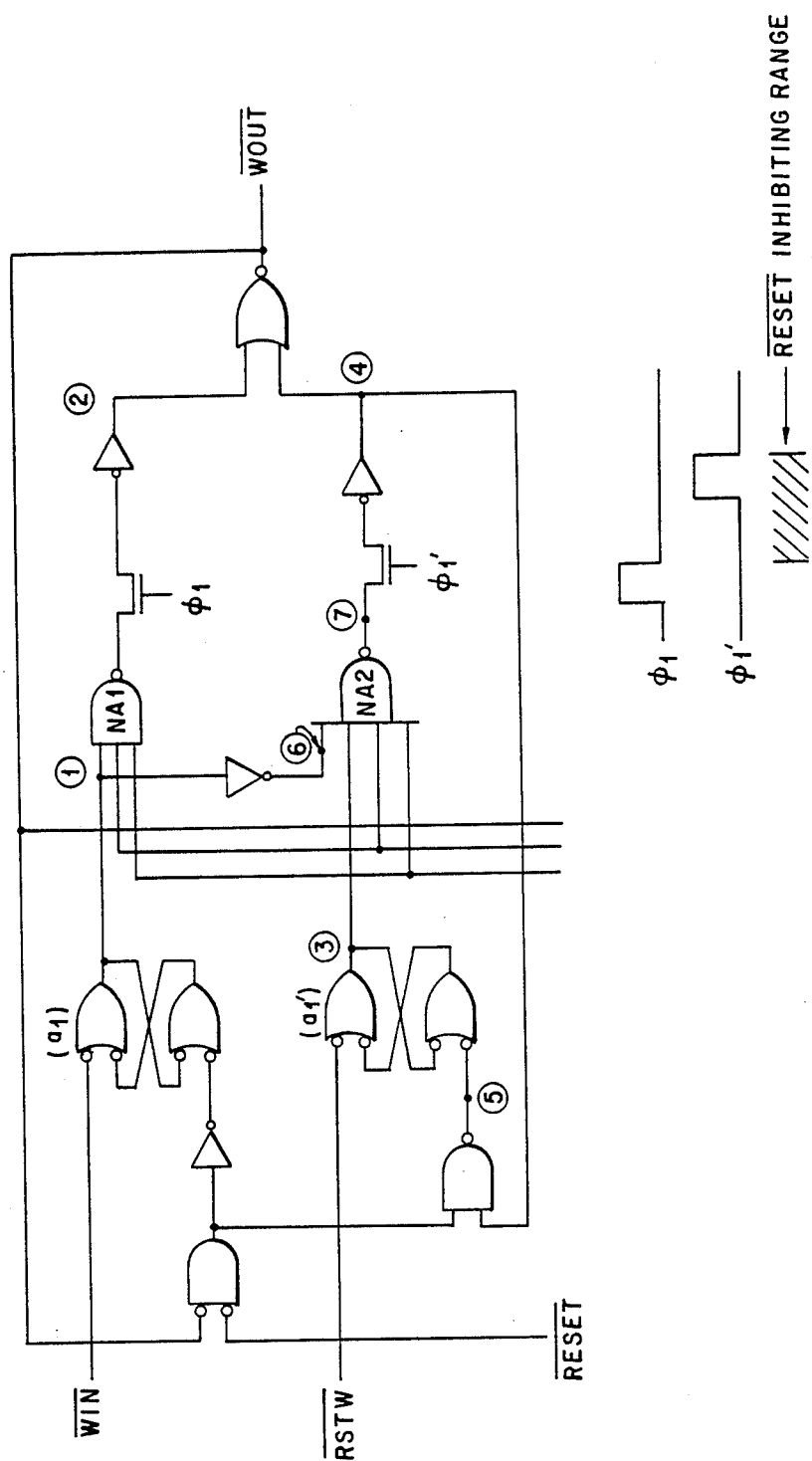
FIG. 2 is a logic circuit diagram showing part of the arbiter circuit of FIG. 1 that is involved in control of the arbiter data write cycle.

FIG. 2 is an embodiment of a circuit to achieve the above operation in controlling the data write cycle. This circuit works as follows.

If $\overline{WIN}$ is generated earlier than $\overline{RSTW}$, $\overline{WIN}$ is executed first with priority. request signal $\overline{WOUT}$ must be generated by the $\overline{WIN}$. After finishing write operation, $\overline{WOUT}$ goes high as was described before. Then a request signal $\overline{WOUT}$ is generated by the $\overline{RSTW}$ As $\overline{WIN}$ is set low, the point ① is high and the point ⑥ is low, so effective signal input to the gate NA2 is inhibited. As a result, $\overline{RSTW}$ is held without being executed until the memory access through the $\overline{WIN}$ request signal is completed. Subsequently, the above process is repeated, for which further description is omitted.

Because of the circuit design used, $\overline{WIN}$ can never get low immediately after $\overline{RSTW}$ becomes low. The circuit configuration of FIG. 2 however requires some restriction on the timing when the $\overline{RESET}$ signal is generated. Namely, after $\phi 1$ becomes low but before $\phi 1'$ resets low after going from low to high, the $\overline{RESET}$ signal must never be set low. Otherwise, an error will be encountered as mentioned next. Assume that request signals $\overline{WIN}$ and $\overline{RSTW}$ have both been generated with both points ① and ③ high and $\overline{WOUT}$ low. As $\overline{RESET}$ is set low after $\phi 1$ switches from high to low, the point ① immediately becomes low, so also the point ⑦ switches low with the point ② staying high. Then, as $\phi 1'$ switches high, the point ⑦ is effectively connected to the subsequent stage to set the point ④ high. If the $\overline{RESET}$ still stays low until this time, the point ⑤ immediately switches low to reset the flip-flop a1'. Namely, the flip-flop a1' resets before execution of the $\overline{RSTW}$ request signal, causing an error. Even if $\overline{RESET}$ is already high, $\overline{WOUT}$ remains low, so the system fails to detect the end of the $\overline{RESET}$ signal, which unavoidably leads to an error. To prevent such error, therefore, the generation of the $\overline{RESET}$ signal must be inhibited during the time range that is indicated by hatching at bottom of FIG. 2.

If the point (2) is used instead of the point (1) to generate the input signal (6) of NAND gate NA2, it is not necessary to impose any restriction on the $\overline{\text{RESET}}$ signal generation timing but no right priority relation can then be assured between $\overline{\text{WIN}}$ and $\overline{\text{RSTW}}$. Namely, immediately after $\phi 1$ switches low, if $\overline{\text{WIN}}$ and $\overline{\text{RSTW}}$ are set low successively in this order, the point (4) becomes high as $\phi 1$ is next set high while the point (2) becomes high as $\phi 1$ is next set high, causing an error again.

Figure 3:
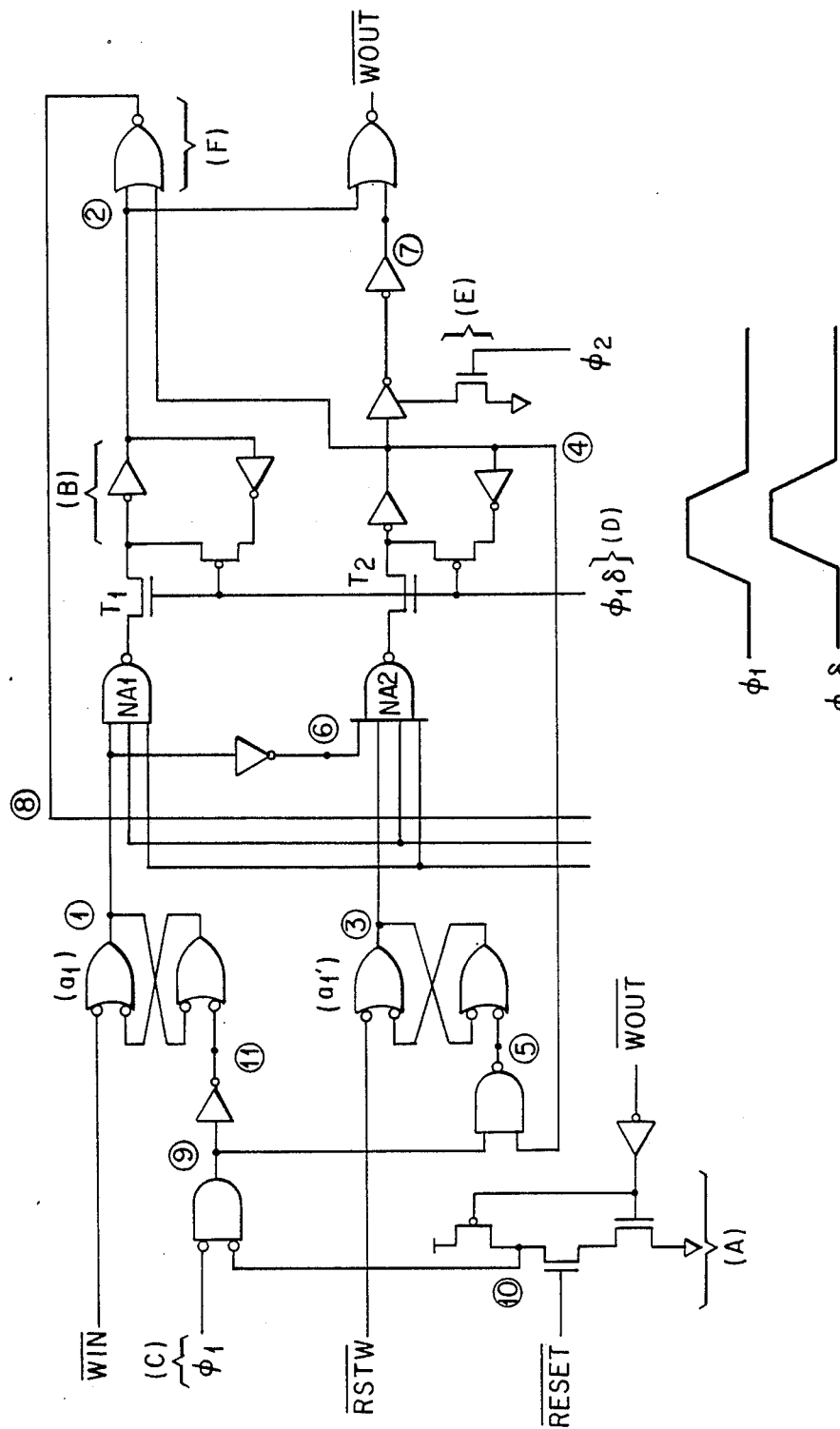
FIG. 3 is a logic circuit diagram that is intended for the same function as the circuit shown in FIG. 2 but is another embodiment.

The circuit of FIG. 3 is free of the above trouble.

In this circuit, a signal generator (A) is intended to generate the $\overline{\text{RESET}}$ signal (10) of necessary duration in response to a one-shot high reset signal.

A latch (B) is not involved in any basic operation but is intended to stabilize the output voltage.

Clock signals at (C) and (D) are related to each other, so these signals are described below together.

$\phi 1\delta$ is a clock that is the same as $\phi 1$ except that the former delays slightly only at the rising edge thereof as compared to the latter. As long as the clock $\phi 1$ applied at (C) is high, the circuit is inhibited from resetting. transistors T1 and T2 on, therefore, neither the point (11) nor the point (5) can be low. This means that the problem caused by flip-flop a1 resetting immediately followed by flip-flop a1' resetting can be prevented.

Figure 4:
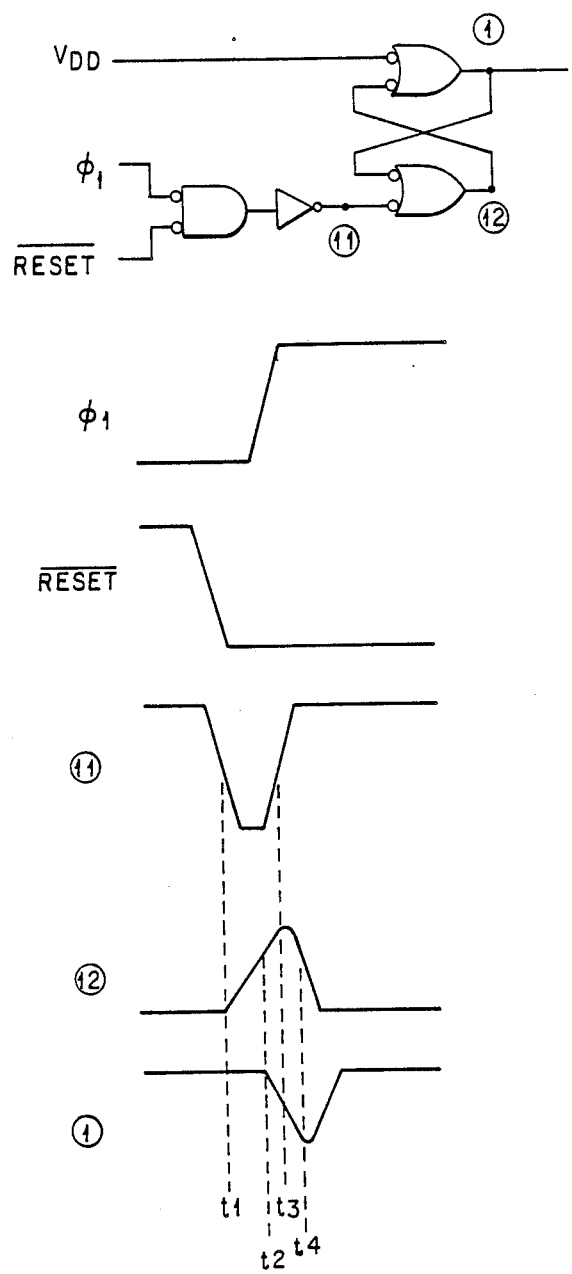
FIG. 4 is a logic circuit diagram of a flip-flop circuit included in the arbiter circuit and showing waveforms of signals at individual points thereof.

The clock $\phi 1\delta$ that differs from $\phi 1$ in the rise timing of its waveform is used at (D) for the following reason:

As shown in FIG. 4, if $\overline{\text{RESET}}$ is set low and then $\phi 1$ rises high immediately thereafter, there appears a sharp pulse at the point (11). As the point (11) gets lower than $\frac{1}{2}V_{DD}$ (at time t1), the point (12) switches from low to high while as the point (12) exceeds $\frac{1}{2}V_{DD}$ (at t2), the point (1) starts to come down from high to low (at t3). At this time, the point (11) has already started rising. Even if the point (11) is already higher than $\frac{1}{2}V_{DD}$, therefore, as long as the point (1) is still higher than $\frac{1}{2}V_{DD}$, the point (12) now starts falling (at t3). The point (1) thus finally pushed back high again (at t4). The above error, which appears only at the rising edge of $\phi 1$, is encountered if the pulse width of $\overline{\text{RESET}}$ is too narrow. The error can be avoided for normal operation by inhibiting data read immediately after the start of the rising edge of $\phi 1$. The clock $\phi 1\delta$ serves for this purpose by delaying such start.

The clock pulse $\phi 2$ at (E) ensures a positive rise up of $\overline{\text{WOUT}}$ to be caused by resetting the $\overline{\text{WIN}}$ signal. It is assumed that the $\overline{\text{WIN}}$ and $\overline{\text{RSTW}}$ signals have already been generated and that the memory array is being accessed in response to the $\overline{\text{WIN}}$ request signal. After data has been written to the memory array, a $\overline{\text{RESET}}$ signal is generated to set the points (2) and (4) low and high, respectively, at the rising edge of $\phi 1\delta$, keeping the point (8) low. Until $\phi 2$ starts rising, however, the gate at (E) does not pass the high signal from the point (4), so the point (7) stays low. Accordingly, $\overline{\text{WOUT}}$ is pushed back high at the rising edge of $\phi 1\delta$ and then set low again at the rising edge of $\phi 2$.

(2) Reset read

Data is read out of the memory array through the read line buffer, which like the write line buffer is also divided into half sections for alternate use. Data is first read from the memory array to the read line buffer. Like the $\overline{\text{WIN}}$ request signal, a $\overline{\text{RIN}}$ request signal is generated just when the top address of one section is read. While one section of the read line buffer is being read sequentially from the top address thereof, subsequent data can thus be read from the memory array to the other section.

Figure 5:
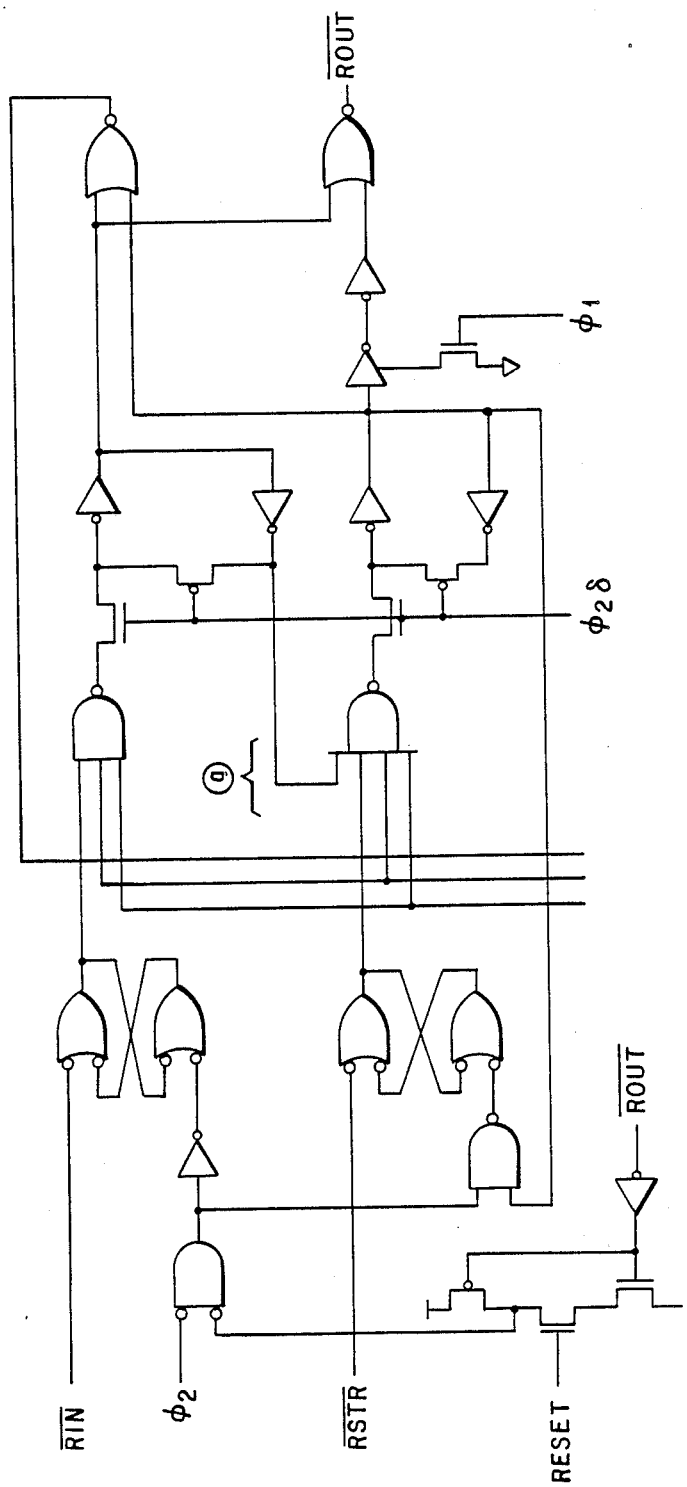
FIG. 5 is a logic circuit diagram showing part of the arbiter circuit involved in control of the read cycle.

As a reset read request signal is provided externally data must be read from the address zero at the rising edge of the next SRCK pulse. For faster response to this reset read request signal, data corresponding to a proper number of bits (for example, 120 bits) is written beforehand from the address zero to a static memory to allow fastest access. It will be readily understood that the above configuration provides the proper read reset operation. The read operation differs from the write operation in that the reset read request signal may be given priority as it is generated. If a $\overline{\text{RIN}}$ request signal is already generated starting data read, namely, if the $\overline{\text{ROUT}}$ signal is set low by a $\overline{\text{RIN}}$ signal before the $\overline{\text{RSTR}}$ signal becomes low, the $\overline{\text{RIN}}$ signal must be executed before the $\overline{\text{RSTR}}$ signal. This is because an $\overline{\text{RSTR}}$ signal, if it occurs just during data read from the dynamic memory, interrupts the operation thereby, threatening damage to on stored data. Accordingly, in spite of priority to $\overline{\text{RSTR}}$, a circuit configuration is used to exceptionally give priority to $\overline{\text{RIN}}$ in the above case (FIG. 5) in which it is devised not to inhibit $\overline{\text{RSTR}}$ generation until the latest time as shown by (a).

Row Address Control

Figure 6A:
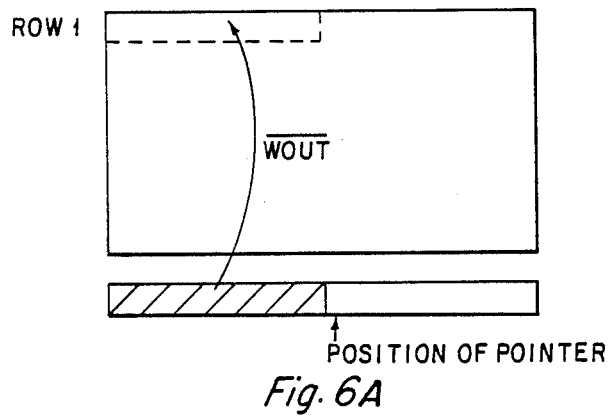
FIGS. 6A, 6B and 6C schematically show the data write control sequence on main memory.
Figure 6B:
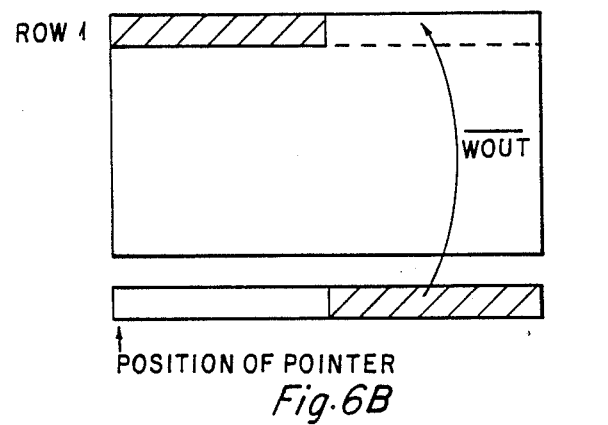
Figure 6C:
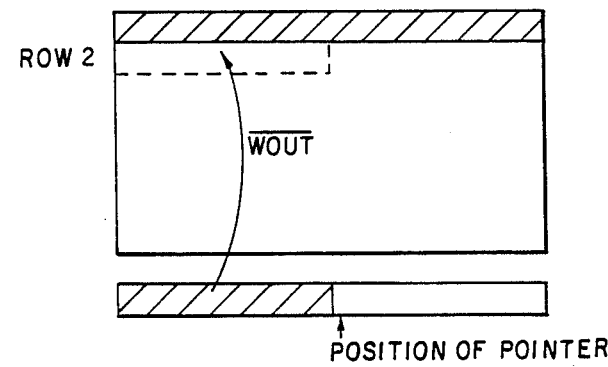

As mentioned above, the write control signal $\overline{\text{WOUT}}$ is generated twice per column. FIGS. 6A, 6B and 6C illustrate the procedure by which data is written to the memory array (indicating the write operation). First, as the first half of the write line buffer gets full and data write to the top address of the latter half thereof starts (namely, when the pointer advances to such top address), $\overline{\text{WIN}}$ is generated and data is transferred to the first half of row 1 of the memory array (FIG. 6A). In FIG. 6B, data is transferred to the latter half of the first row. When the pointer advances to a position as show by the arrow in FIG. 6C, a signal to request transfer of data from the first half of the write line buffer to the memory array is generated again. This time, however, data must be written to the second row, so it is necessary to increment the row address. The row address is incremented for data write and for data read by the signals WAHI and RAHI, respectively. Basically, WAHI and RAHI are generated in the same timing as $\overline{\text{WOUT}}$ when the pointer advances to the position shown by the arrow in FIGS. 6A and 6C, respectively. The signals WAHI and RAHI are suppressed when the pointer is located at the same position as shown by the arrow in FIG. B. The pointer's position is determined by the most significant bit $\overline{\text{WAMSB}}$ of a column counter.

If no consideration is given to $\overline{\text{RSTW}}$, the circuit of FIG. 7 would suffice. As already mentioned, however, if a $\overline{\text{RSTW}}$ signal is generated, data that has been written to the write line buffer previously must be transferred to the memory array. At this time, if the write pointer is in the first half of the write line buffer, the row address must be incremented while no such increment may be made with the write pointer in the second half of the write line buffer. Though this may appear to be the reverse to of what occurs with $\overline{\text{WIN}}$, it should be understood that consideration must be given as to whether data to be transferred is in the first or second half of the write line buffer.

It is also noted that as $\overline{\text{RSTW}}$ is generated, the column address is reset. It is therefore necessary to fetch $\overline{\text{WAMSB}}$ just before the generation of such $\overline{\text{RSTW}}$. FIG. 8 is an example of the circuit involved.

Because of its design as an address counter, the row address counter cannot be reset while the memory is being accessed. As the memory access started by an $\overline{\text{RSTW}}$ signal is completed, $\overline{\text{VRW3}}$ is set high, and since the point ① is kept high at least over the time "t" as shown in FIG. 8, a $\overline{\text{WAVR}}$ signal is generated just during that time.

Figure 9A:
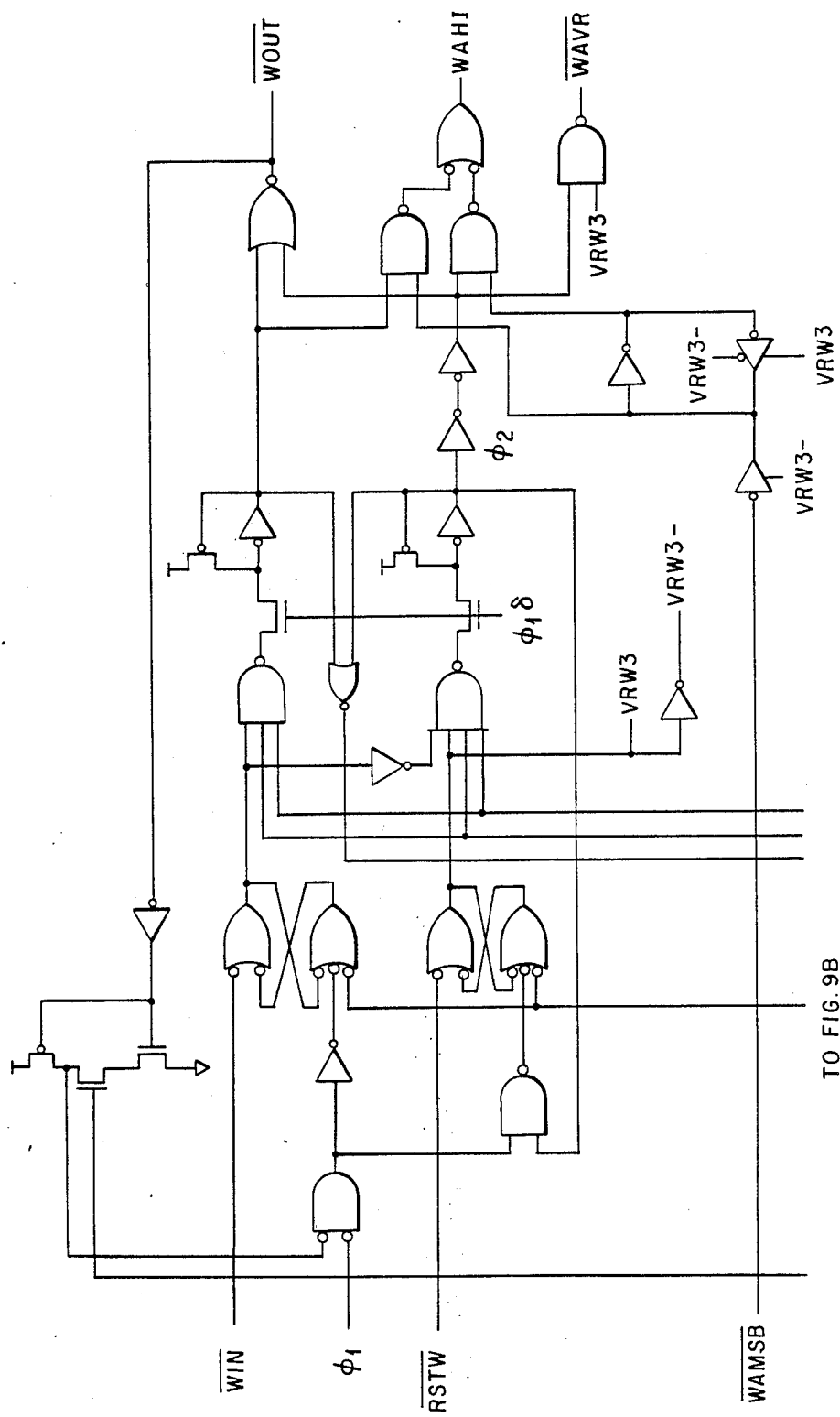
FIGS. 9A and 9B show a full circuit diagram of an arbiter circuit in accordance with the present invention.
Figure 9B:
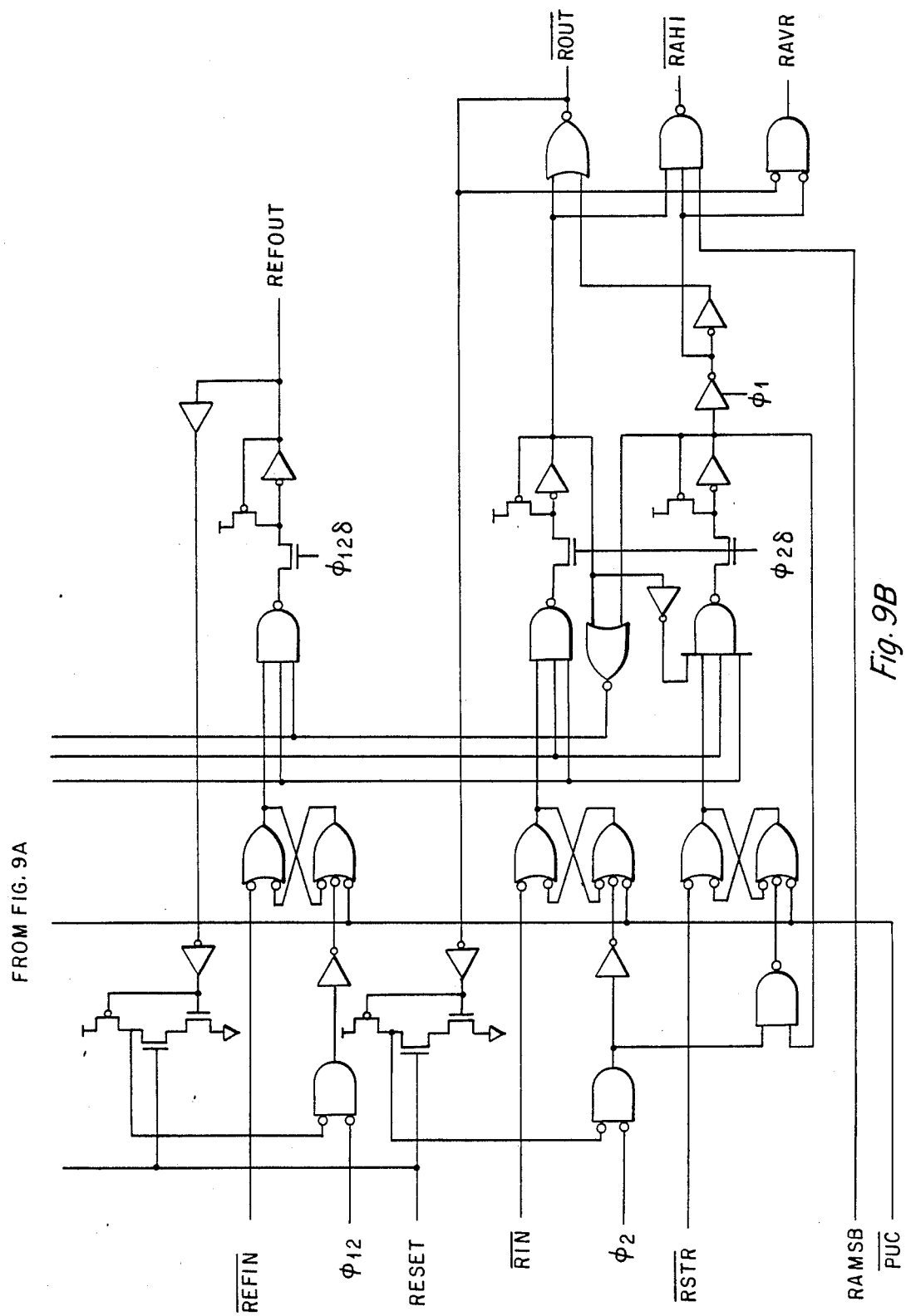

To read data, the relation of $\overline{\text{RIN}}$ and $\overline{\text{RAHI}}$ may be just the same as the relation of $\overline{\text{WIN}}$ and $\overline{\text{WAHI}}$. If an $\overline{\text{RSTR}}$ signal is generated, however, the data read operation from the read line buffer starts instead of a data write operation. Simultaneously, data is read from the top portion of a dynamic memory array to the read line buffer. Accordingly, the row address counter must be reset and generation of $\overline{\text{RAHI}}$ be suppressed. FIGS. 9A and 9B illustrate a circuit configuration that satisfies all of the above requirements.

As already mentioned, the arbiter circuit embodying the invention, with both an oscillator to generate the refresh signal and a counter attached, includes the following basic circuit elements: RS flip-flops to temporarily hold read, write, and refresh signals, NAND gates to inhibit transfer of any signal during execution of another signal, clock gates to synchronize read, write and refresh signals that are generated asynchronously, and AND gates with a pair of inverted inputs to perform an OR logic function to indicate the end of a read, write or refresh signal to reset the circuit. Accordingly, the arbiter circuit can provide proper control for efficient operation of the FIFO memory while minimizing the number of circuit components. Naturally, to be compatible with the FIFO memory, the arbiter circuit of the invention must be able to control read and write reset signals as input from an external source.

Figure 10:
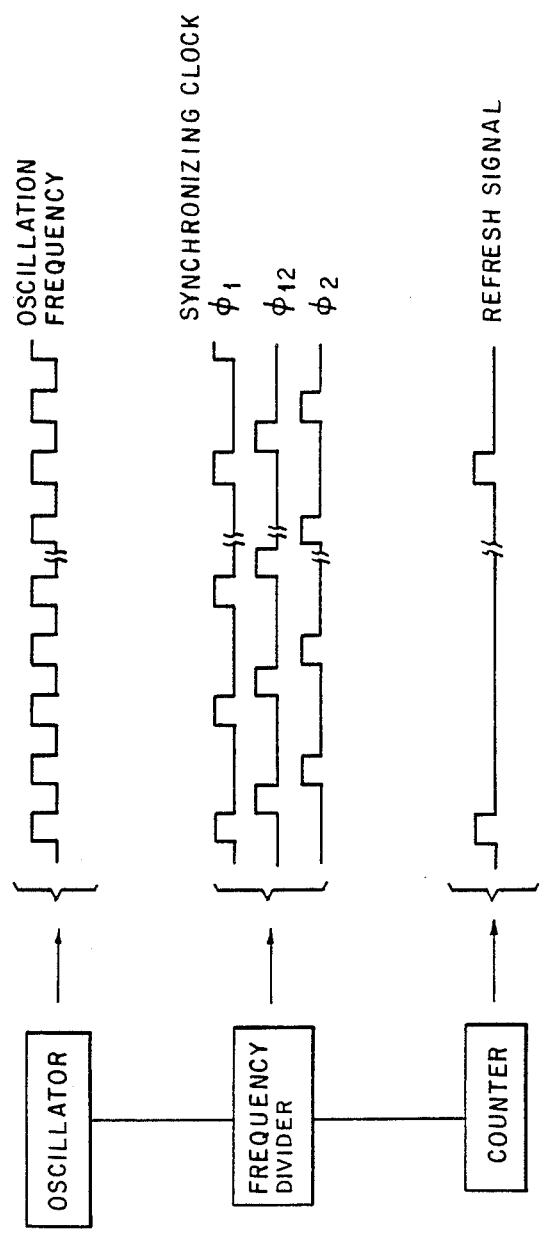
FIG. 10 shows respective waveforms of various signals generated.

Further, the arbiter circuit of the invention has a relatively low power consumption for the following reason. If synchronizing clocks as shown in FIG. 10 are designed for a shorter clock cycle, read, write and refresh signals, as they are generated, may be executed with shorter delay. To provide a faster clock cycle, however, the oscillator used to generate clock pulses must have a higher oscillation frequency, which increases the power consumption of the oscillator itself. Though a 3 phase clock is used in FIG. 10, therefore, an improvement via lowered power consumption may be achieved by using a 2 phase clock. This reduces the clock cycle to two thirds, resulting in a reduction of the power consumption. An approach to achieve such an improvement in lowered power consumption involves the use of a single oscillator both as the refresh signal generator and as a synchronizing clock pulse generator (see FIG. 10). With this approach, the refresh signal is synchronized with the synchronizing clock. For example, it is possible to design a circuit that generates refresh signals, each at the rising edge of a $\phi 1$ pulse. In this case, overlapping of $\phi 1$ and $\phi 12$ or $\phi 12$ and $\phi 2$, if any, is no problem, since the refresh synchronizing signal $\phi 12$ is known in advance during the refresh mode.

Figure 12:
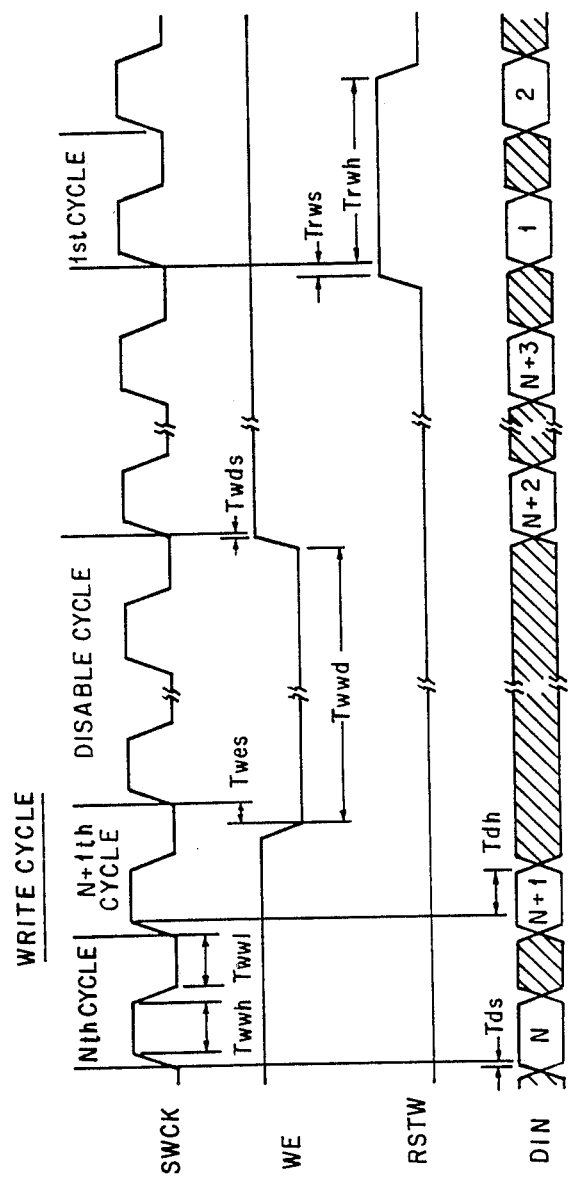
FIG. 12 is a timing chart of signals for the write cycle of the memory of FIG. 11.
Figure 13:
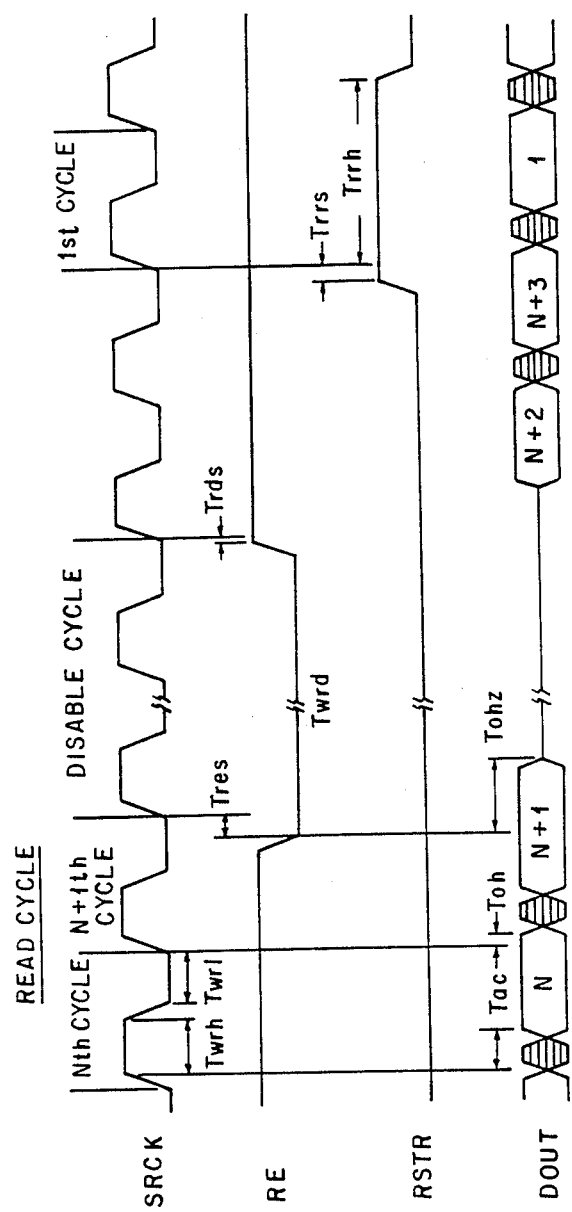
FIG. 13 is a timing chart of signals for the read cycle of the memory of FIG. 11.

An example of a FIFO memory with the arbiter circuit built in is described next with reference to FIGS. 11 to 13. The FIFO memory of FIG. 11 uses a memory array formed by a matrix of dynamic memory elements as a main memory. The following six components are used to provide the FIFO memory:

(1) For the main memory, a plurality of 1 transistor type memory cells are used, which are the same as the memory cells of a DRAM, an IC memory that allows high circuit integration at rather low production cost.

(2) The DRAM requires the user to provide refresh and precharge control by himself. With the FIFO memory of FIG. 11, however, an internal circuit is provided for self-refresh and -precharge control.

(3) A dedicated write line buffer is provided so the data write cycle may be adjusted freely in a wide range from high speed ($30 \times 10^{-9}$ sec) to low speed ($10^4$ to 1 sec).

(4) A dedicated read line buffer is provided so data can be read out without any synchronization with the data write operation at a data read cycle that can be adjusted in the same range as the data write cycle.

(5) A static type line buffer is provided to allow quick response to the reset signal ("return-to-top address" signal).

(6) Means to correct for defective bits is provided to effectively improve the production yield by enabling otherwise unusable memories to be operable.

Figure 11:
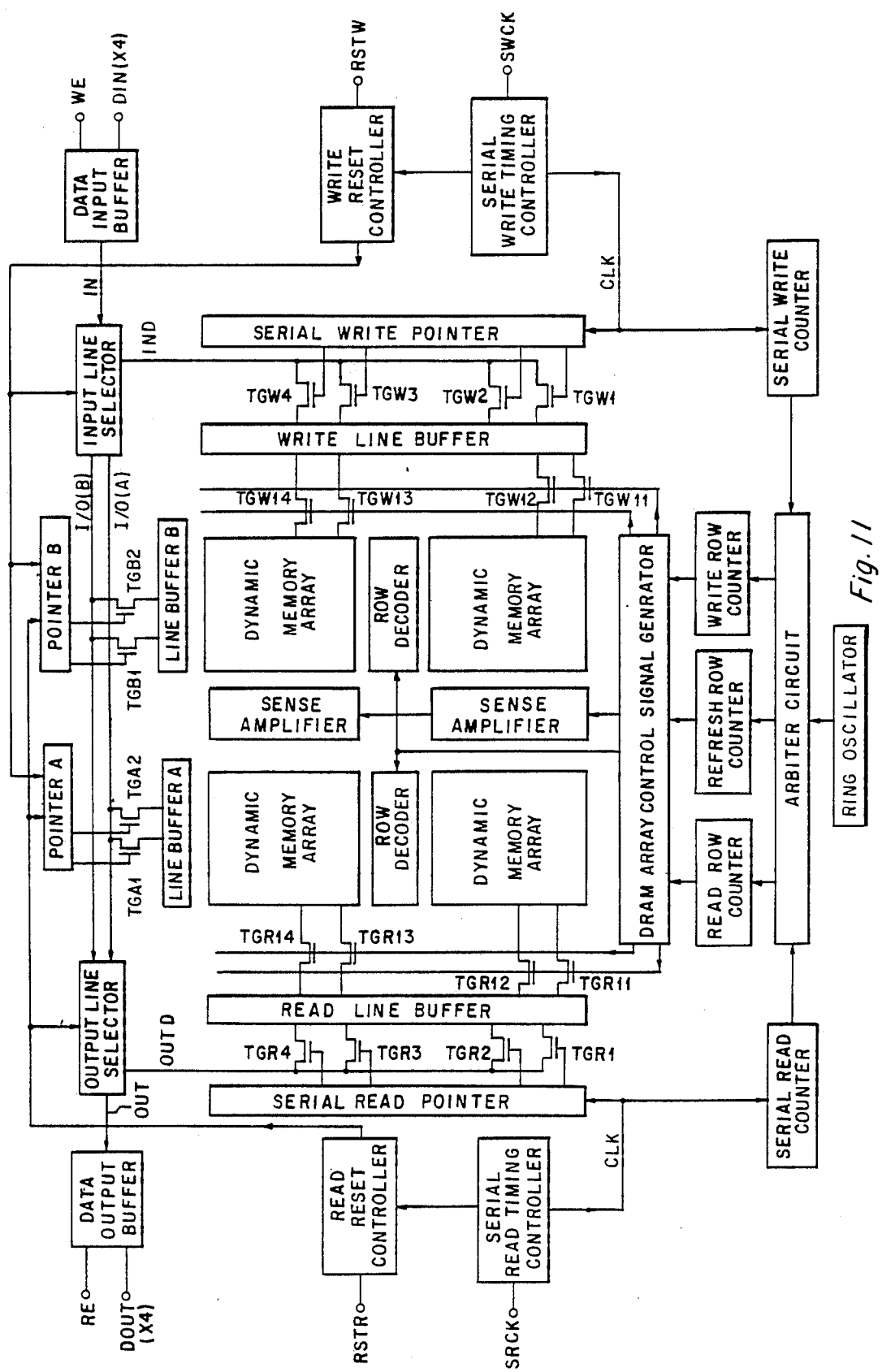
FIG. 11 is a block diagram of a large capacity FIFO memory device as disclosed in copending U.S. application Ser. No. 094,943 filed Sept. 9, 1987, now U.S. Pat. No. 4,882,710 issued Nov. 21, 1989, in which an arbiter circuit in accordance with the present invention may be incorporated.

Referring to the FIFO memory configuration of FIG. 11, it should be noted that the data read and data write operations are normally executed independently of each other. Therefore, in the following description, both the data read and data write operations are assumed to proceed independently of each other unless otherwise specified.

In FIG. 11, WE is the external input signal for data write control. Namely, as long as WE is high, data input from an external data input terminal $D_{IN}$ is written to the memory as effective data. RSTW is an input signal to indicate the start of write data by the rising edge thereof (FIG. 12). SWCK is a clock to control the write cycle.

RE is the external input signal for data read control. Namely, as long as the RE signal is high, data is output from the terminal $D_{OUT}$ in synchronization with SRCK.

RSTR is a signal to indicate the start of read data. Namely, the rising edge of RSTR indicates the start of read data (see FIG. 13).

Data Write Operation

Step 1. First, the RSTW input signal switches from low to high to set the data write address to zero inside the memory device. There, the following sequence of operations follow. First, the rising edge of RSTW is detected by a proper circuit to indicate to the input line selector the occurrence of a reset signal. Upon reception of such signal, this line selector electrically connects I/0(A) to IN with both I/0(B) and IND disconnected from IN. Simultaneously, data transfer gates $T_{GB1}$ and $T_{GB2}$ on the line buffer B that are connected to I/O(B) and data transfer gates $T_{GW1}$ through $T_{GW4}$ on the write line buffer that are connected to IND all switch off. The pointer B and serial write pointer thus reset, while the pointer A indicates the address zero, opening the gate $T_{GA1}$. This leads to data write from the data input buffer through IN and I/O(A) to the address zero of line buffer A.

Step 2; Synchronous with SWCK pulses, data is then written sequentially to subsequent addresses of line buffer A.

Step 3; As all available addresses of the line buffer A become filled with data, a data transfer route switchover request signal is conveyed from the pointer A to the input line selector, which then disconnects IN from I/0(A) to reconnect to IND.

Step 4; Synchronous with SWCK pulses, the serial line pointer sequentially opens data transfer gates $T_{GW1}$, $T_{GW2}$, ... on the write line buffer to write data from $D_{IN}$ to the write line buffer.

Step 5; As soon as the serial write pointer opens $T_{GW3}$, a write request signal WRQ to write data from the first half of the write line buffer to the dynamic memory array is generated for transmission to the arbiter circuit.

Step 6; Subsequently, data can be written sequentially by successively incrementing the row decoder's address by one at each time until the dynamic memory array is filled.

If another reset write signal RSTW is generated during the above operation, this signal is also conveyed to the input line selector. This time, however, I/0(B) is connected to IN with I/0(A) and IND disconnected from IN. As all the available addresses of line buffer B are full with data, an operation similar to the step 3 disconnects IN from I/0(B) to reconnect to IND. Similar data write operations follow.

With the next RSTW, IN is connected to I/0(A) again. Namely, lines I/0(A) and I/0(B) are alternately connected to IN every time an RSTW signal is generated.

Both line buffers A and B are preferably constructed of a plurality of the full static type memory elements. The reason why such a configuration is used concerns the data read operation. Therefore, the relevant explanation will be given in the description of the data read operation that follows.

Data Read Operation:

Data is read by the following operational sequence.

Step 1; By changing RSTR from low to high, the data read address in the memory device is set to zero. An internal circuit then detects the rising edge of RSTR to indicate the occurrence of a reset signal both to the output line selector and to the arbiter circuit. Receiving the signal, the output line selector connects OUT to either I/0(A) or I/0(B). Namely, if data is then being written through one of these two lines I/0(A) and I/0(B), the output line selector connects OUT to the other line that is free. This means that as long as RSTW and RSTR are successively generated within a certain time duration, the data read of old data is assured. The purpose is to have an operation consistent with data read from the dynamic type main memory array, about which a description is given later. If neither I/0(A) nor I/0(B) is connected to IN, the line that has been used by the last RSTW generated before the occurrence of RSTR is connected to OUT. In this case, new data is read. Until the next RSTW is generated, the same data is ready to be read repeatedly. RSTR is an external signal input by the operator at an indefinite time. For a quick response to the occurrence of such an RSTR signal, therefore, the static type memory is preferably used an signal for the line buffer memories A and B because of its ability to be read at a fast rate. Though the static type memory is lacking in integrated circuit density as compared to a dynamic type memory, the line buffers A and B provided with a memory capacity of only around 100 bits work satisfactorily, which has a negligible effect on the total dimensions of the memory device.

As an RSTR signal is conveyed to the arbiter circuit, a read request signal RRQ is generated to read data from the dynamic memory array to the line buffer, so necessary data may be read out in a proper duration of time. This is to prepare for data supply after all data is read out of the line buffer A or B that is now being read.

Step 2; Synchronized with the SRCK clock, data is read out of the line buffer A or B.

Step 3; As soon as the above line buffer has been read through to the last address thereof, the pointer A or B gives a data line switch request signal to the output line selector to connect OUT to OUTD.

Step 4; By Step 1, the first half of read line buffer has already been loaded with data to be read out, so data is read out through the line OUT without interruption. As soon as the serial read pointer opens the gate $T_{GR1}$, an RRQ signal is generated and input to the arbiter circuit to start reading necessary data from the dynamic memory array to the second half of the read line buffer.

Repeated input of the RSTR signal leads to repeated read of the same data.

On a FIFO memory of ideal design, data can be read and written independently with no synchronization. With an actual FIFO memory device having a limited memory capacity, however, there are some restrictions on data read and write operations.

For easier understanding of the above point, the following description is given with respect to the writing and reading of video data to and from a FIFO memory device. A memory capacity corresponding to a frame of video signal is assumed for the FIFO memory (according to the NTSC system, which is the standard system in Japan, wherein a full scan of a screen picture comprises 525 scanning lines and a frame of video signals is defined as the video data corresponding to these 525 scanning lines).

The video signal is sequentially written from top to bottom of a picture to the FIFO memory until the last data of a frame is finally reached with the memory being filled with video data. If the video signal is further continuously written (namely, if the second frame of the video signal is also sequentially written), the memory contents are sequentially replaced with the second frame of video data from the top address. Of course, if the WE signal is set low to inhibit data write of the second and subsequent frames, the first frame of video data remains in the memory, which can be read out repeatedly by the data read procedure.

The above description refers to the configuration of FIG. 11. However, for example, a modification that as the memory gets full, an internal signal is generated to alert the operator or another modification that the overwrite can be inhibited by creating the same internal condition as achieved when WE is low will readily be materialized.

With the configuration of FIG. 11, if data is continuously written as mentioned above, either the preceding frame or the current frame that is being written is read, depending on the setting of the read timing. More particularly, the selection of which frame is to be read is determined by the delay in timing with which a RSTR signal is generated after the last RSTW signal. The critical delay time is determined by the memory capacity of the line buffer A (the line buffer B has the same memory capacity as the line buffer A). For example, with a 100 bit line buffer A, the old data is read if an RSTR signal is generated within 100 SWCK cycles after generation of the last RSTW signal.

However, even if an RSTR signal is generated more than 100 cycles after generation of the last RSTW signal, data read of new data is not always assured. This time, the critical factor is the time necessary to transfer data in the main memory circuit from the write line buffer to the memory array and from the memory array to the read line buffer.

More specifically, referring to a 200 bit read line buffer and 200 bit write line buffer, the condition in which new data can be read out is described below.

First, it is assumed that the line buffer A has been loaded with the first 100 bits of a new frame of video data, while the second 100 bits from the 101st bit to the 200th bit have been written to addresses 1 through 100 of write line buffer.

As the 201st bit has been written to the address 101 of the write line buffer, a WRQ signal is generated (as already mentioned). Data transfer to the memory array is always complete before the 301st bit is written. At this timing, therefore, an RRQ request signal can be generated (namely, by inputting the RSTR signal as mentioned above) to transfer data from the 101st through 200th bit of the memory array to the read line buffer.

Namely, data read of new data is assured if an RSTR signal is generated more than 300 SWCK cycles after generation of the last RSTW signal (namely, after 300 bits of data have been written).

If an RSTR signal is generated 100 to 300 SWCK cycles after generation of the last RSTW signal, no decision can be made whether to read old or new data. It is therefore only within this time range that the operator is prohibited to input any RSTR signal.

Since data read and write need not be synchronous, the clock cycles of both clock SWCK and SRCK can be changed freely, except that to avoid mixing of old and new data or any other confusion, the clocks SWCK and SRCK must be set to such clock cycles that at any time when the clock SWCK is at the mth cycle after the occurrence of a RSTW signal at the 0th cycle of this clock and the clock SRCK is at the nth cycle after the occurrence of a RSTR signal at the 0th cycle of the second clock, m and n must satisfy an inequality $m-n<=100$ or $m-n>=300$.

It is noted that in the circuit of FIG. 11 the dynamic memory used as the main memory element can be refreshed, as mentioned below, by an internal circuit without recourse to any external signal control.

The basic design of the above FIFO MEMORY device includes line buffers for serial to parallel and parallel to serial conversion of data, further having an oscillator or oscillators, for example, of ring type, a counter or counters to count the oscillation frequency from such oscillators, signal generators to generate the read and write request signals, another signal generator to generate the refresh request signal, and an arbiter circuit that determines priority between read, write and refresh signals as they are generated depending on given circumstances. In this case, the refresh operation is executed by dividing the oscillation frequency of the oscillator by use of a proper counter to generate a refresh request signal RFRQ at proper intervals. The memory is thereby refreshed internally without recourse to any external signal control. Accordingly, an efficient memory device is provided that reduces the operating burden on a user and yet is available for data read and write even during the refresh mode.

It will be evident that various modifications can be made to the described embodiments without departing from the scope of the present invention.

For example, components of the arbiter circuit can be modified and changed variously. The memory device may also be changed. Further, additional elements and components may be added to the arbiter circuit, as necessary.

Accordingly, as mentioned above, the arbiter circuit according to the invention can provide an effective control circuit to sequentially and consistently execute memory access signals, or read, write and refresh signals as they are asynchronously generated in a desired priority order according to given situations.

What is claimed is:

1. An arbiter circuit for providing priority control of dynamic memory operations in determining the order in which dynamic memory access signals such as write, read and refresh signals are executed, said arbiter circuit comprising:

first circuit holding means comprising a plurality of holding circuits for temporarily holding dynamic memory access signals and corresponding to write, read and refresh request signals respectively, each of said holding circuits having an input for receiving the one of said write, read and refresh request signals corresponding thereto;

second circuit inhibiting means comprising a plurality of inhibit logic gates for inhibiting transfer of a dynamic memory access signal when another dynamic memory access signal is already being executed and corresponding to write read and refresh request signals respectively, each of said inhibit logic gates having a plurality of inputs, one of said inputs for each said inhibit logic gate being connected to the output of a corresponding one of said plurality of holding circuits;

third circuit synchronizing means comprising a plurality of synchronizer switches for synchronizing individual dynamic memory access signals and corresponding to write, read and refresh request signals respectively, each of said switches being connected to the output of a corresponding one of said inhibit logic gates and being respectively respective to a synchronizing signal for transmitting an output signal from said inhibit logic gate corresponding thereto as a memory access signal for one of the write, read and refresh functions;

fourth circuit reset means comprising a plurality of reset logic gates for resetting the arbiter circuit upon the end of each dynamic memory access signal and corresponding to write, read and refresh request signals respectively, each of said reset logic gates having a plurality of inputs, and one of said inputs of each of said reset logic gates begin adapted to receive a reset signal for application of said reset signal to each of said reset logic gates simultaneously; and a plurality of feedback lines respectively connected at one end thereof at the output of a synchronizer switch and at its other end to another input of said reset logic gate for each circuit arrangement corresponding to said write, read and refresh request signals respectively, said plurality of feedback lines including a first feedback line associated with said write request signal and being connected to inputs of said inhibit logic gates associated with said refresh and said read request signals, a second feedback line associated with said refresh request signal and being connected to inputs of said inhibit logic gates associated with said write and said read request signals, and a third feedback line associated with said read request signal and being connected to inputs of said inhibit logic gates associated with said write and said refresh request signals.

2. An arbiter circuit as set forth in claim 1, wherein said synchronizer switches are responsive to clocked synchronizing signals to determine priority as between a plurality of memory access signals for queueing memory access signals for data write, data read and memory refresh for sequential execution thereof in a priority order headed by a write request signal, followed by a refresh request signal and a read request signal.

3. An arbiter circuit as set forth in claim 1, wherein said plurality of holding circuits of said first circuit holding means comprises a plurality of RS flip-flop circuits for temporarily holding memory access signals;

said plurality inhibit of logic gates of said second circuit inhibiting means comprising NAND gates to inhibit transfer of a memory access signal during the execution of another memory access signal;

said synchronizer switches of said third circuit synchronizing means comprising a plurality of transistors having gates to which clocked synchronizing signals are respectively applied for synchronizing memory access signals which are asynchronously generated; and said reset logic gates of said fourth circuit reset means comprising logic gates having the OR function for transmitting the reset signal to reset the arbiter circuit upon the completed execution of each memory access signal.

4. An arbiter circuit as set forth in claim 3, wherein said transistors are responsive to clocked synchronizing signals applied to the gates thereof so as to be rendered conductive for selectively transmitting memory access signals only during the time that a respective transistor is conductive.

5. An arbiter circuit as set forth in claim 1, further including a reset write circuit arrangement operably coordinated with the circuit arrangement corresponding to said write request signal, said reset write circuit arrangement including:

a reset write holding circuit having an input for receiving a reset write signal;

an inhibit reset write logic gate having a plurality of inputs, one of said inputs being connected to the output of said reset write holding circuit; and a reset write synchronizer switch connected to the output of said inhibit reset write logic gate and being responsive to a synchronizing signal applied thereto to transmit the output of said inhibit reset write logic gate as an output signal;

an output logic gate having a pair of inputs respectively connected to the outputs of the circuit arrangement corresponding to said write request signal and said reset write circuit arrangement and having an output for providing the write request output signal; and said first feedback line associated with said write request signal being connected at its said one end at the output of said output logic gate and at its said other end to said another input of said reset logic gate for said circuit arrangement corresponding to said write request signal.

6. An arbiter circuit as set forth in claim 5, further including a reset read circuit arrangement operably coordinated with the circuit arrangement corresponding to said read request signal, said reset read circuit arrangement including a reset read holding circuit having an input for receiving a reset read signal;

an inhibit reset read logic gate having a plurality of inputs, one of said inputs being connected to the output of said reset read holding circuit; and a reset read snchronizer switch connected to the output of said inhibit reset read logic gate and being responsive to a synchronizing signal applied thereto to transmit the output of said inhibit reset read logic gate as an output signal;

first and second output logic gates having respective pairs of inputs connected to the outputs of the circuit arrangement corresponding to said read request signal and said reset read circuit arrangement and respectively having outputs for providing the read request output signal; and said third feedback line associated with said read request signal being provided as a compositive feedback line including subordinate feedback lines respectively connected at one end thereof to the outputs of said first and second output logic gates, one of said subordinate feedback lines being connected at its other end to said another input of said reset logic gate for the circuit arrangement corresponding to said read request signal, and the other of said subordinate feedback lines being connected to said inputs of said inhibit logic gates associated with said write and said refresh request signals.

7. An arbiter circuit as set forth in claim 6, further including respective signal generators corresponding to the circuit arrangements for each of said write, read and refresh request signals and being connected to said one of said inputs of each of said reset logic gates for generating the reset signal in response to a reset control signal.

* * * * *